United States Patent
Suzuki et al.

(10) Patent No.: US 8,268,183 B2
(45) Date of Patent: Sep. 18, 2012

(54) METHOD OF PROCESSING SOLID SURFACE WITH GAS CLUSTER ION BEAM

(75) Inventors: Akiko Suzuki, Tokyo (JP); Akinobu Sato, Tokyo (JP); Emmanuel Bourelle, Montmirail (FR); Jiro Matsuo, Kyoto (JP); Toshio Seki, Kyoto (JP)

(73) Assignee: Japan Aviaton Electronics Industry, Limited, Tokyo (JP)

( * ) Notice: Subject to any disclaimer, the term of this patent is extended or adjusted under 35 U.S.C. 154(b) by 562 days.

(21) Appl. No.: 12/312,266

(22) PCT Filed: Oct. 30, 2007

(86) PCT No.: PCT/JP2007/071459
§ 371 (c)(1),
(2), (4) Date: Jul. 21, 2009

(87) PCT Pub. No.: WO2008/054013
PCT Pub. Date: May 8, 2008

(65) Prior Publication Data
US 2009/0305507 A1  Dec. 10, 2009

(30) Foreign Application Priority Data

Oct. 30, 2006 (JP) ................... 2006-293687

(51) Int. Cl.
*B44C 1/22* (2006.01)
*C23F 1/00* (2006.01)
*G21G 5/00* (2006.01)

(52) U.S. Cl. ........... 216/66; 216/58; 216/63; 250/492.1; 250/492.2; 250/492.21

(58) Field of Classification Search .......... None
See application file for complete search history.

(56) References Cited

U.S. PATENT DOCUMENTS

| | | | |
|---|---|---|---|
| 2005/0092432 A1* | 5/2005 | Fukushima et al. | ....... 156/345.4 |
| 2005/0155951 A1 | 7/2005 | Suzuki | |
| 2006/0278611 A1 | 12/2006 | Sato et al. | |

FOREIGN PATENT DOCUMENTS

| | | |
|---|---|---|
| EP | 1 670 048 | 6/2006 |
| JP | 05-102083 | 4/1993 |
| JP | H06-291095 | 10/1994 |

(Continued)

OTHER PUBLICATIONS

First office action for corresponding South Korean patent application No. 10-2009-7008402 issued Dec. 22, 2010.

(Continued)

*Primary Examiner* — Shamim Ahmed
*Assistant Examiner* — Bradford Gates
(74) *Attorney, Agent, or Firm* — David N. Lathrop

(57) ABSTRACT

A solid surface is processed while corner portions of a relief structure are protected from deformation. A method of processing a solid surface with a gas cluster ion beam includes a cluster protection layer formation step of forming, on the solid surface, a relief structure having protrusions with a cluster protection layer formed to cover an upper part thereof and recesses without the cluster protection layer; an irradiation step of emitting a gas cluster ion beam onto the solid surface having the relief structure formed in the cluster protection layer formation step; and a removal step of removing the cluster protection layer. A thickness T of the cluster protection layer satisfies $$T > nY + \left( \frac{b^2 Y^2 n - nY^2(b^4 - 16a^2)^{\frac{1}{2}}}{2} \right)^{\frac{1}{2}},$$

where n is a dose of the gas cluster ion beam, and Y is an etching efficiency of the cluster protection layer, expressed as an etching volume per cluster (a and b are constants).

6 Claims, 14 Drawing Sheets

FOREIGN PATENT DOCUMENTS

| | | |
|---|---|---|
| JP | 2005-175369 | 6/2005 |
| WO | WO 2005/019316 | 3/2005 |
| WO | WO 2005/031838 A1 | 4/2005 |

OTHER PUBLICATIONS

Extended European Search Report issued Apr. 28, 2010 for corresponding European patent application No. 07 831 192.5.

First office action issued May 5, 2010 for corresponding Chinese patent application No. 2007 80040678.0.

Yamada, "Cluster ion beam process technology—20 years of R&D history", Nuclear Instruments and Methods in Physics Research, B257, 2007, pp. 632-638.

Office Action issued on Dec. 6, 2011 by the Japanese Patent Office for counterpart foreign patent application JP 2008-542206.

* cited by examiner

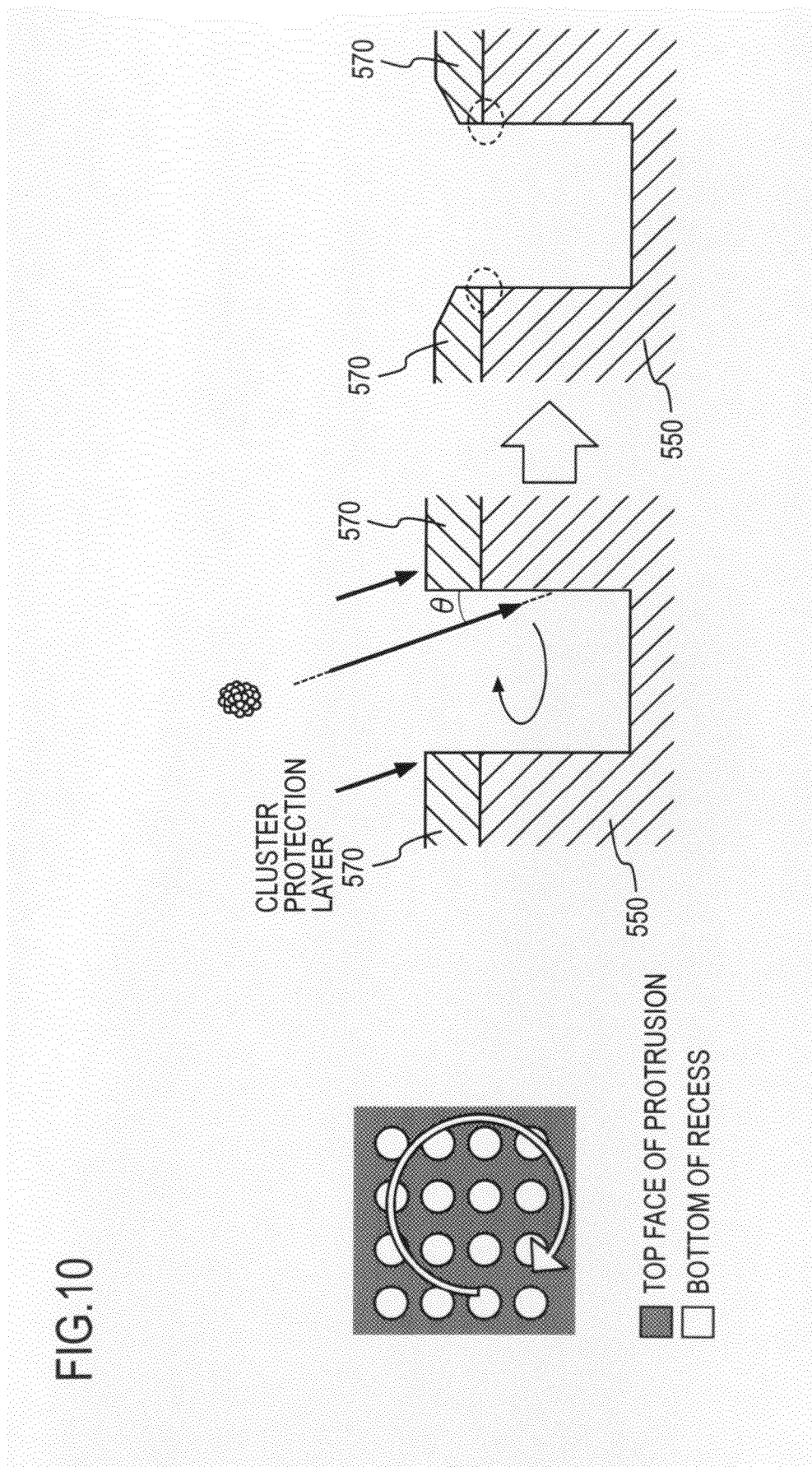

METHOD OF PROCESSING SOLID SURFACE WITH GAS CLUSTER ION BEAM

TECHNICAL FIELD

The present invention relates to a method of processing a solid surface with gas cluster ion beam irradiation.

BACKGROUND ART

Semiconductor devices, electronic devices, and photonic-crystal and other optical devices are fabricated by forming submicrometer (around 0.1 μm to 1 μm) precision pattern structures on a face of a semiconductor wafer and the like. In semiconductor quantum devices, an array of ultra-fine particles or lines measured in nanometers, which are called quantum dots or quantum wires, is formed on a surface of a substrate. The size and surface roughness of the relief structures (pattern structures, structures formed by an array of ultra-fine particles, etc.) formed on those devices are important factors that affect the performance of the devices. Therefore, high precision is essential for the formation of the relief structure.

The precision of the relief structure depends on the precision of a film formation processes, an etching processes, and other fabrication processes. It is not easy to form a relief structure with a precision of up to a few nanometers. Generally, in these devices fabricated through the film formation process, etching process, and so on, a great number of chips are formed on the surface of a semiconductor wafer. However, it is difficult to form uniform relief structures across the entire surface of the semiconductor wafer. To solve these problems, a process to improve the precision of the structure (such as smoothing) is conducted after the relief structure is formed.

One smoothing technology disclosed in International Publication Number WO2005/031838 (Patent literature 1) smoothes out side walls of a pattern structure and the like by irradiating it with a gas cluster ion beam.

DISCLOSURE OF THE INVENTION

On the basis of the knowledge that a gas cluster ion beam emitted to a solid surface obliquely at an angle of 60 to 90 degrees (the symbol ° will be used to express an angle) with respect to the normal to the surface smoothes out the surface better than an approximately perpendicularly emitted beam, the technology disclosed in Patent literature 1 uses oblique irradiation to smooth out side walls of a relief structure. Approximately perpendicular irradiation is conducted at an irradiation angle of about 0° with respect to the normal to the solid surface.

Although the side walls of the relief structure irradiated with the gas cluster ion beam are smoothed out, it has been found that corner portions of the relief structure are deformed by the influence of the gas cluster ion beam irradiation.

The finding indicates that the gas cluster ion beam emitted onto the side walls of the relief structure cannot perform adequate surface processing to smooth out the exposed surface, while keeping its contour similar to the contour of the relief structure.

In view of these problems, an object of the present invention is to provide a method of processing a solid surface, while preventing corner portions of a relief structure from being deformed.

To solve the problems described above, a method of processing a solid surface with a gas cluster ion beam according to the present invention includes a cluster-protection-layer formation step of forming, on the solid surface, a relief structure having protrusions with a cluster protection layer formed to cover an upper part thereof and recesses without the cluster protection layer; an irradiation step of emitting the gas cluster ion beam onto the solid surface on which the relief structure has been formed in the cluster-protection-layer formation step; and a removal step of removing the cluster protection layer.

In short, the gas cluster ion beam is emitted onto the solid surface having the relief structure with the cluster protection layer formed on the upper part of the protrusions.

In this processing method, the cluster-protection-layer formation step may include a masking process of forming the cluster protection layer to cover the solid surface; and an etching process of etching the solid surface having the cluster protection layer formed in the masking process, thereby forming the relief structure having the recesses reaching the solid and the protrusions with the cluster protection layer left on the upper part thereof.

It is preferred that a thickness T [cm] of the cluster protection layer satisfy Equation (r1):

$$T > nY + \left(\frac{b^2Y^2n - nY^2(b^4 - 16a^2)^{\frac{1}{2}}}{2}\right)^{\frac{1}{2}}, \tag{r1}$$

where n is a dose [ions/cm$^2$] of the gas cluster ion beam; and Y is an etching efficiency of the cluster protection layer, given as an etching volume per cluster [cm$^3$/ion] (a is a proportionality factor [ions/cm$^2$] between nY$^2$ [cm$^4$/ion] and an area S [cm$^2$] of a region of the cluster protection layer etched by the gas cluster ion beam, in a cross section perpendicular to a direction in which the protrusions or the recesses extend; and b is a proportionality factor [ions$^{1/2}$cm$^{-1}$] between Yn$^{1/2}$ [cm$^2$·ions$^{-1/2}$] and a length L [cm] of an oblique side of the region of the cluster protection layer etched by the gas cluster ion beam).

How Equation (r1) is derived will be described later. Satisfying Equation (r1) is a necessary and sufficient condition for the thickness of the cluster protection layer that can prevent the shape of the corner portions of the relief structure from being deformed.

In particular, if an Ar gas cluster ion beam is used, it is preferred that the thickness T [cm] of the cluster protection layer satisfy:

$$T > nY + (1.54*10^{16}*nY^2)^{1/2}.$$

If an SF$_6$ gas cluster ion beam is used, it is preferred that the thickness T [cm] of the cluster protection layer satisfy:

$$T > nY + (1.23e*10^{15}*nY^2)^{1/2}.$$

In the irradiation step, the gas cluster ion beam may be alternately emitted obliquely onto opposite side walls of the relief structure, and the solid may be rotated on an axis approximately parallel to the normal to the solid surface on which the relief structure is formed while being irradiated with the gas cluster ion beam.

BRIEF DESCRIPTION OF THE DRAWINGS

FIG. 10 is a view showing that corner portions of the relief structure are protected from deformation when the solid is rotated while it is being irradiated with the gas cluster ion beam (example 3).

BEST MODES FOR CARRYING OUT THE INVENTION

Prior to the description of an embodiment, the principle of solid surface processing in the present invention will be outlined.

The inventors conducted a variety of experiments and found that the lateral transfer of a substance, which is characteristic to a gas cluster ion beam (GCIB), is deeply involved in the deformation of corner portions of a relief structure by the GCIB emitted on it. As a result of thorough examination, the inventors have first succeeded in quantitatively clarifying the relationship between the GCIB irradiation conditions and the shape and amount of deformation of the corner portions and clarifying the mechanism of deformation of the corners.

The relief structure here means a pattern structure such as a line-and-space pattern of a few nanometers to submicrometers formed on a solid plane of a silicon substrate, SOI (silicon on insulator), or the like and a rise-and-fall structure such as a structure including an array of ultrafine particles such as quantum dots.

The corner portion of the relief structure is a corner portion in the upper part of the side wall of the relief structure (the wall of a protrusion which is a structure portion protruding from a solid plane or the wall of a recess which is a recessed structure portion in a solid plane). The upper part here is on the side far from the solid plane on which the relief structure is formed.

The lateral transfer of a substance is the transfer of atoms in a GCIB irradiation area of the solid surface in a direction approximately parallel to the solid surface. This phenomenon contributes to the smoothing of the substrate surface.

The mechanism of deformation of corner portions of the relief structure will be described below, by using a line-and-space pattern structure as an example of the relief structure, with reference to a sectional view of the line-and-space pattern structure.

Figure 1A:
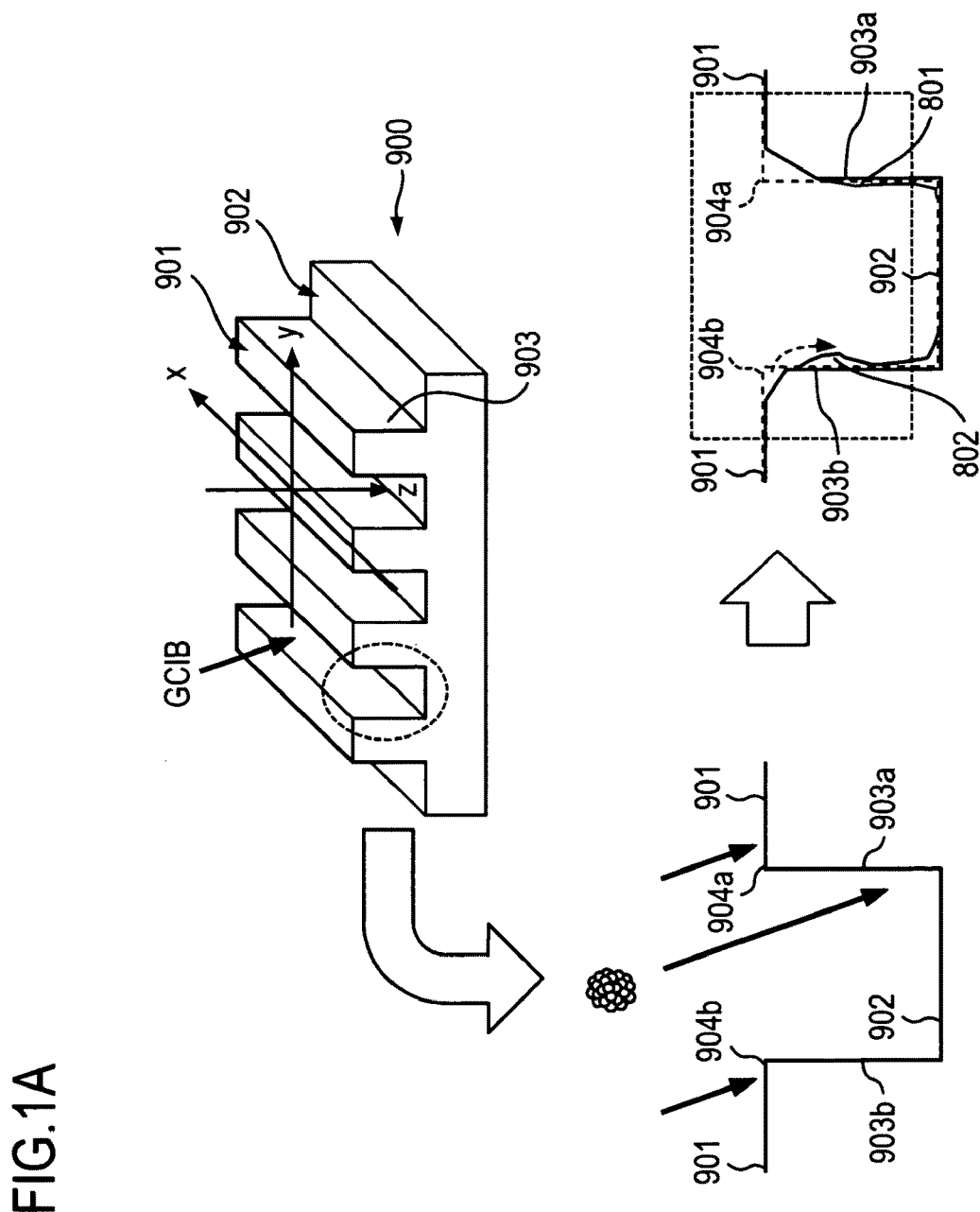
FIG. 1A is a view illustrating a mechanism of deformation of corner portions of a relief structure.

As shown in FIG. 1A, a line-and-space pattern structure 900 is irradiated with a GCIB. A side wall 903 of a line of the line-and-space pattern structure 900 is irradiated with the GCIB obliquely. Gas cluster ions collide with corner portions 904a and 904b of lines 901 as well, causing substances forming the corner portions 904a and 904b of the lines 901 to travel laterally. The lateral transfer is represented by a dashed arrow in the bottom right diagram in FIG. 1A. The substance traveling laterally on the side wall 903 of the line toward the bottom of a space 902 runs and deposits on the side wall 903 of the line and protrudes into the space 902.

Figure 1B:
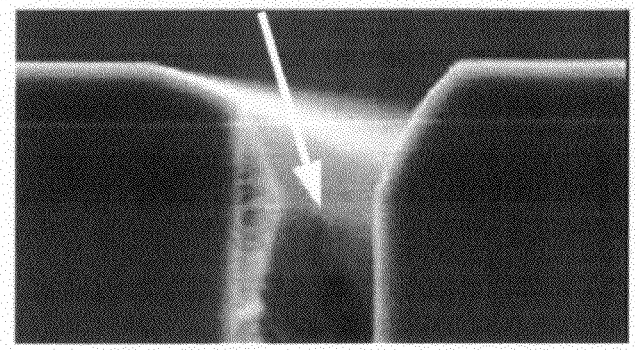
FIG. 1B is an electron micrograph of deformed corners of the relief structure.

In oblique irradiation, a side wall A 903a of the line facing the incident GCIB continues to be irradiated with the GCIB, and a deposit 801 of the substance on the side wall A 903a of the line travels further laterally. Under the conditions of oblique irradiation almost parallel to the side wall A 903a of the line, the amount of lateral transfer in the direction of GCIB irradiation increases, causing hardly any lateral transfer toward the corner portion 904a in the upper part of the side wall A 903a of the line. A side wall B 903b of an adjacent line facing the side wall A 903a of the line is not irradiated with the GCIB, so that a deposit 802 on the side wall B 903b of the line does not travel laterally toward the corner portion in the upper part of the side wall B 903b of the line. This deforms the corner portions 904a and 904b of the line 901, forming incline portions inclined relative to the space 902 (see FIGS. 1A and 1B; FIG. 1B is an electron micrograph of the portion enclosed by a dashed square in FIG. 1A.)

The mechanism of deformation of corner portions caused by the GCIB irradiation is as described above. The corner portions are deformed by approximately perpendicular irradiation as well (the two side walls of a line become analogous to the side wall B of the line).

As the amount of lateral transfer of a substance per cluster increases, the oblique angle of an incline portion formed per unit dose increases, increasing the amount of substance staying on the side wall of the line or the bottom of the space. The side wall A 903a of the line facing the incident GCIB is exposed to the GCIB more than the side wall B 903b of an adjacent line facing the side wall A 903a of the line. This difference makes the oblique angle in the upper part of the side wall A 903a of the line greater than the oblique angle in the upper part of the side wall B 903b of the line. Part of the substance 801 staying on the side wall A 903a of the line is eliminated by etching and becomes less than the substance 802. When the substance extending from the corner portion 904a to the space 902 travels to the side wall A 903a of the line, the substance which has already been deposited is less likely to block the transfer. Therefore, the transfer of the substance to the side wall A 903a of the line is promoted at the corner portion 904a in the upper part of the side wall A 903a of the line, consequently increasing the oblique angle.

Neither the relationship between the amount of lateral transfer of substance and the dose of the GCIB nor the relationship between the amount of lateral transfer of substance and the etching efficiency of the substance had been clarified. Therefore, experiments were conducted with a variety of combinations of substances and clusters, and the relationships were studied. As a result, relationships expressed by Equations (1) and (2) below were obtained (a description will be given later). The multiplication symbol * may be omitted in some cases.

$$S = anY^2 \quad (1)$$

$$L = bY\sqrt{n} \quad (2)$$

In the incline portion formed by the GCIB irradiation, $\phi$ is the oblique angle, and L is the length of the oblique side. The oblique angle $\phi$ is the oblique angle of the incline portion formed in the upper part of the side wall A 903a of the line facing the incident GCIB. For the definition of the angle, see FIG. 2. The length L of the oblique side is the length of the oblique side of the incline portion formed in the upper part of the side wall A 903a of the line facing the incident GCIB (see FIG. 2). The dose [ions/cm$^2$] is represented by n, and the etching efficiency of the substance (etching volume per cluster) [cm$^3$/ion] is represented by Y.

Proportionality factors a and b are constants determined by the GCIB conditions. To be more specific, a [ions/cm$^2$] is the proportionality factor between nY$^2$ [cm$^4$/ion] and the cross-sectional area S [cm$^2$] of the deformed corner portion, and b [ions$^{1/2}$cm$^{-1}$] is the proportionality factor between Yn$^{1/2}$ [cm$^2$·ions$^{-1/2}$] and the length L [cm] of the oblique side.

The cross-sectional area S of the deformed corner portion corresponds to an area of a region (corner portion, which is a shaded portion in FIG. 2) etched most by the GCIB in a cross section perpendicular to the direction in which the protrusion or recess extends. The length L of the oblique side corresponds to the length of the oblique side of the cross section perpendicular to the direction in which the protrusion or recess extends, of a region etched most by the gas cluster ion beam.

Equation (1) expresses that the volume of the corner portion removed by deformation per unit depth is proportional to the square of the etching efficiency Y and the dose n. The unit depth is the x-axis direction in FIG. 1A and is the direction in which the protrusion or recess extends. The volume per unit depth corresponds to the cross-sectional area S of the deformed corner portion. The cross-sectional area S can be expressed by using the length L of the oblique side, the depth d of deformation in the direction of film thickness (z-axis direction in FIG. 1A), and the oblique angle $\phi$, as in Equation (3):

$$S = \frac{d}{2}L\cos\phi. \quad (3)$$

Equation (2) expresses that the length L of the oblique side is proportional to the etching efficiency Y and the square root of the dose n.

Figure 2:
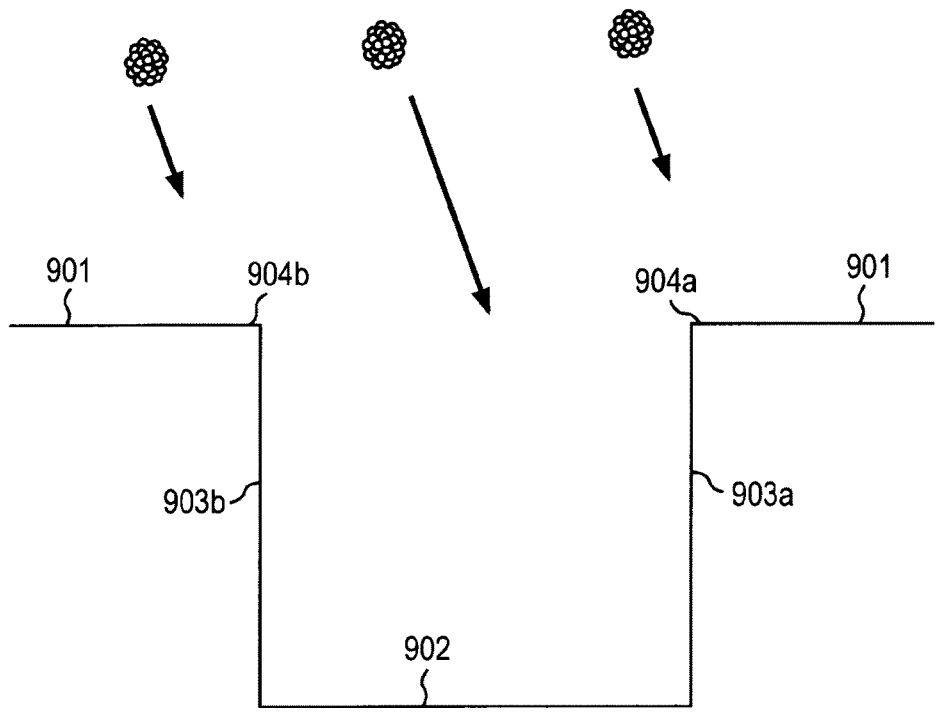
FIG. 2 is a view showing definitions of the length L of the oblique side, the oblique angle φ, and the depth d of deformation.
Figure 2:
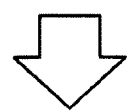
Figure 2:
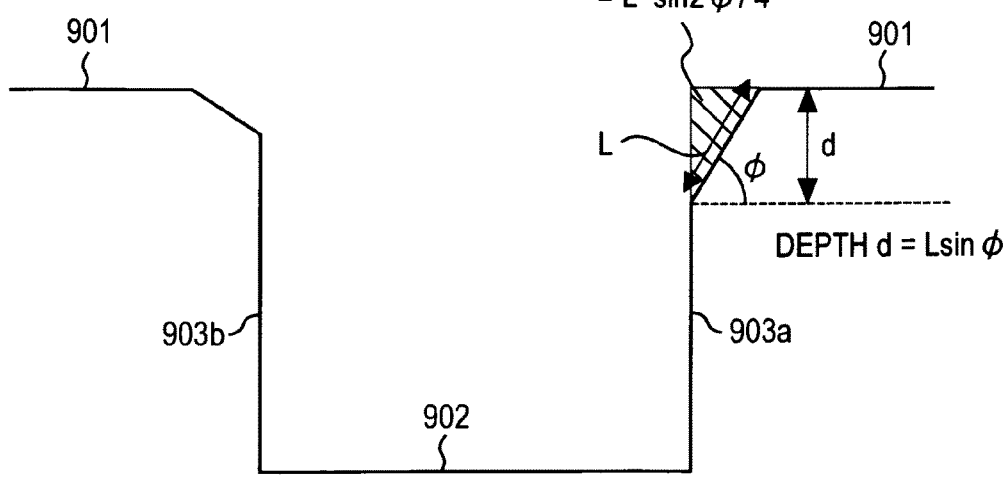

The depth d of deformation in the direction of film thickness can be obtained by the relationship expressed by Equation (4) (see FIG. 2).

$$d = L \sin \phi \quad (4)$$

Based on these equations, if the dose n of the GCIB to be used and the etching efficiency Y of a solid substance under the irradiation conditions are determined, the oblique angle $\phi$ of the incline portion in the upper part of the side wall A 903a of the line and the depth d of deformation can be predicted.

Figure 3:
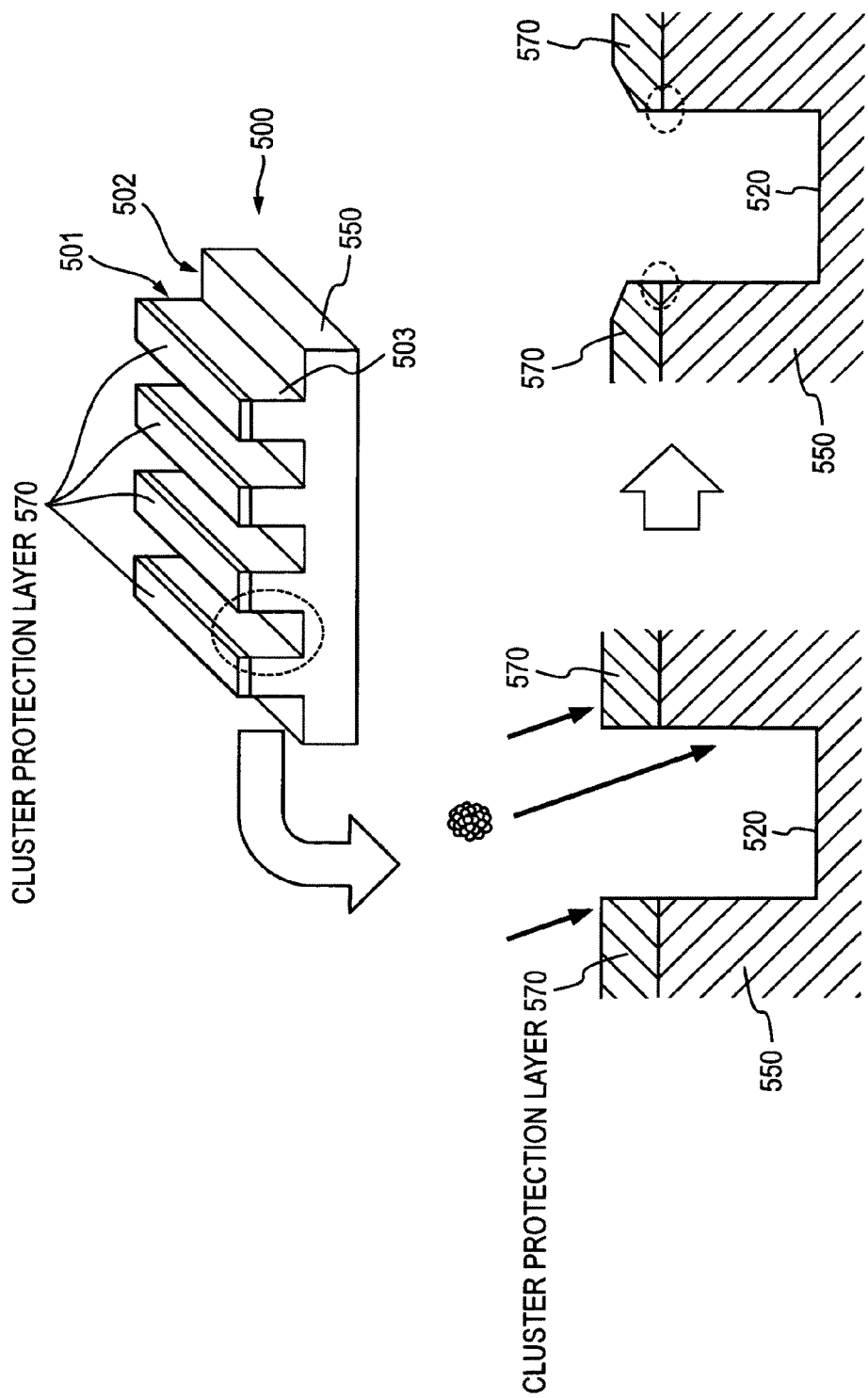
FIG. 3 is a view illustrating how a cluster protection layer prevents the corner portions of the relief structure from being deformed.

If the deformation, especially the maximum deformation, of the corner portion caused by the GCIB irradiation arises just on a layer (referred to as a cluster protection layer 570) formed on the top face of a line 501 in a line-and-space pattern structure 500 by a material differing from the material of the solid 550, surface smoothing or other surface processing can be conducted on the side wall 503 of the line without deforming the corner portions of the line 501 (see FIG. 3, especially parts circled by dashed lines in the bottom right diagram in FIG. 3). When the cluster protection layer 570 is formed, the optimum thickness (such necessary and sufficient thickness that the corner portions of the line 501 will not be deformed) can be selected in accordance with Equation (6).

Equations (3) and (4) are substituted into Equations (1) and (2) respectively; $\phi$ and L are eliminated; and a simultaneous equation concerning d is obtained. By solving the simultaneous equation, Equation (5) is obtained:

$$d = \left( \frac{b^2Y^2n - nY^2(b^4 - 16a^2)^{\frac{1}{2}}}{2} \right)^{\frac{1}{2}}. \quad (5)$$

If the decrease $d_o = n*Y$ of the thickness of the cluster protection layer 570 by etching is considered, the thickness T [cm] of the cluster protection layer 570 should satisfy Equation (6):

$$T > nY + \left( \frac{b^2Y^2n - nY^2(b^4 - 16a^2)^{\frac{1}{2}}}{2} \right)^{\frac{1}{2}}. \quad (6)$$

How Equations (1) and (2) are derived will be described specifically in accordance with the results of experiments using an Ar (argon) gas cluster.

A line-and-space pattern structure was fabricated on the surface of a variety of solid materials (silicon (Si), silicon dioxide (SiO$_2$), and chromium (Cr)). In the line-and-space pattern structure, lines and spaces have an equal width of 5 µm. The groove depth (line height) was 1 µm for silicon, 1 µm for silicon dioxide, and 300 nm for chromium. The line-and-space pattern structure was fabricated as described below. The equipment used for the fabrication will be described later.

Fabrication on silicon was as follows. The surface of the silicon substrate was thermally oxidized to form an oxide film on the surface of the silicon substrate. The oxide film was coated with electron beam resist, and a line-and-space pattern was drawn. After the resist was developed, the resist pattern was used as a mask when the thermally oxidized film was etched. After the resist was removed, the thermally oxidized film was used as a hard mask when the silicon was etched. The thermally oxidized film was removed by ashing, and the line-and-space pattern structure was obtained.

Fabrication on silicon dioxide was as follows. The surface of the silicon substrate was thermally oxidized to form an oxide film on the surface of the silicon substrate. The thermally oxidized film ($SiO_2$) was coated with electron beam resist, and a line-and-space pattern was drawn. After the resist was developed, the resist pattern was used as a mask when the thermally oxidized film was etched. The resist was removed, and the line-and-space pattern structure was obtained.

Fabrication on chromium was as follows. The surface of the silicon substrate was coated with electron beam resist, and a line-and-space pattern was drawn. After the resist was developed, a chromium film was deposited by sputtering. The thickness of the deposited chromium film was 300 nm. The resist was removed, leaving the chromium film on a part where there was no resist (lift-off method), and the line-and-space pattern structure was obtained.

Figure 4A:
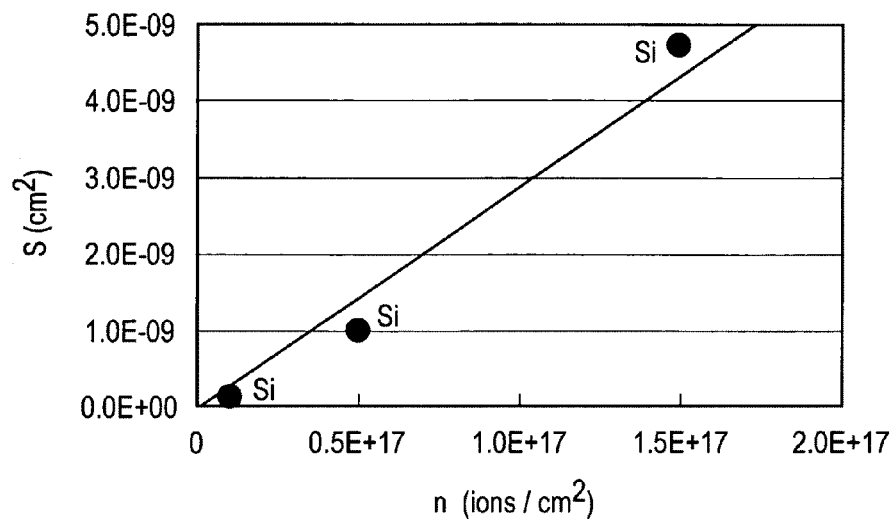
FIG. 4A is a graph showing a relationship between a dose n and a cross-sectional area S of a deformed corner portion when the solid substance is silicon and an Ar gas cluster ion beam is used.

The relationship between the dose n and the cross-sectional area S and the relationship between the dose n and the length L of the oblique side were clarified first. When the dose n and the cross-sectional area S were observed, an Ar cluster ion beam was used with a constant etching efficiency Y, which means that the same material (silicon) was used. The relationship obtained as a result showed that an increase in the dose n increased the cross-sectional area S linearly (FIG. 4A).

Figure 4B:
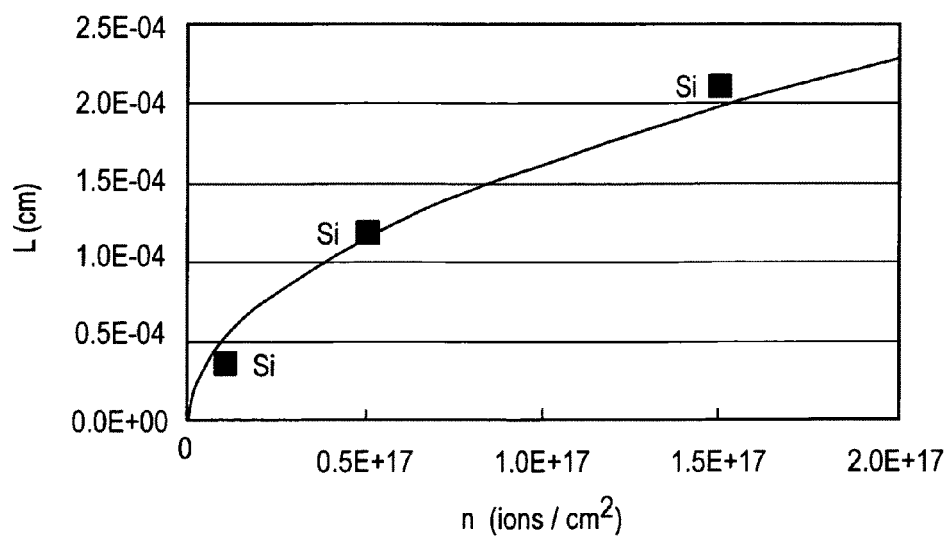
FIG. 4B is a graph showing a relationship between the dose n and the length L of the oblique side when the solid substance is silicon and the Ar gas cluster ion beam is used.

The length L of the oblique side and the dose n were observed on silicon (Si) used as the solid material, and it was found that the length L of the oblique side was nearly proportional to $n^{0.5}$ (see FIG. 4B). The relationship suggests that the lateral transfer of substance is governed by random walk. It is thought that the length L of the oblique side of the incline portion is derived from the fact that the distance of lateral transfer of atoms in the solid material is proportional to the square root of the number n of irradiation events.

The relationship between the length L of the oblique side and the etching efficiency Y and the relationship between the cross-sectional area S ($=L^2 \sin(2\phi)/4$) and the etching efficiency Y were examined on a variety of solid materials having different etching efficiencies Y.

Figure 4C:
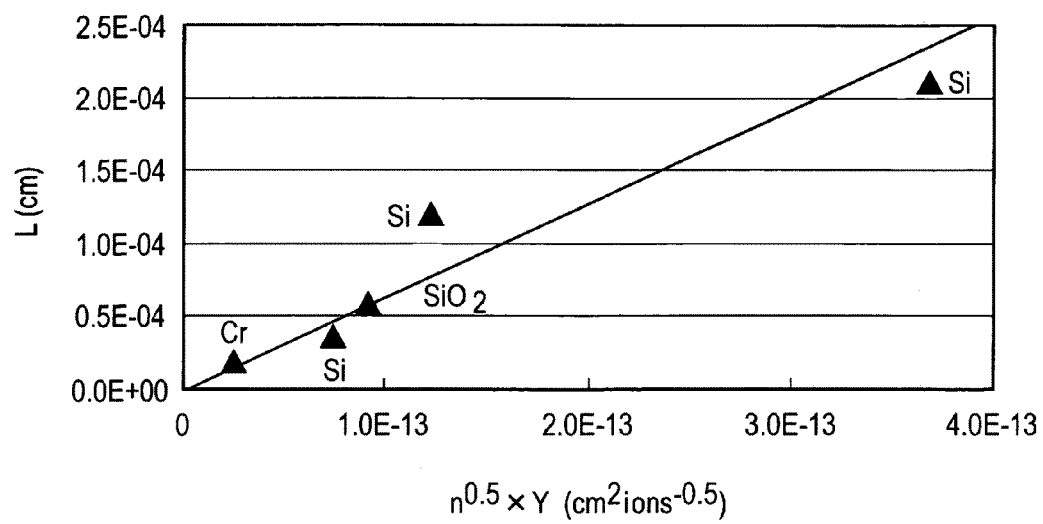
FIG. 4C is a graph showing a relationship between the length L of the oblique side and a product of an etching efficiency Y and $n^{0.5}$ when the Ar gas cluster ion beam is used on a variety of solid substances (silicon, silicon dioxide, and chromium)

FIG. 4C is a graph showing the relationship between the length L of the oblique side and the product of the etching efficiency Y and $n^{0.5}$ of silicon, silicon dioxide, and chromium. Because the relationship $L \propto n^{0.5}$ had been obtained already, as described earlier, the relationship between the length L of the oblique side and the etching efficiency Y can be inferred from the relationship between the length L of the oblique side and $Y*n^{0.5}$. It can be interpreted that most of the obtained data points are on a single straight line.

Figure 4D:
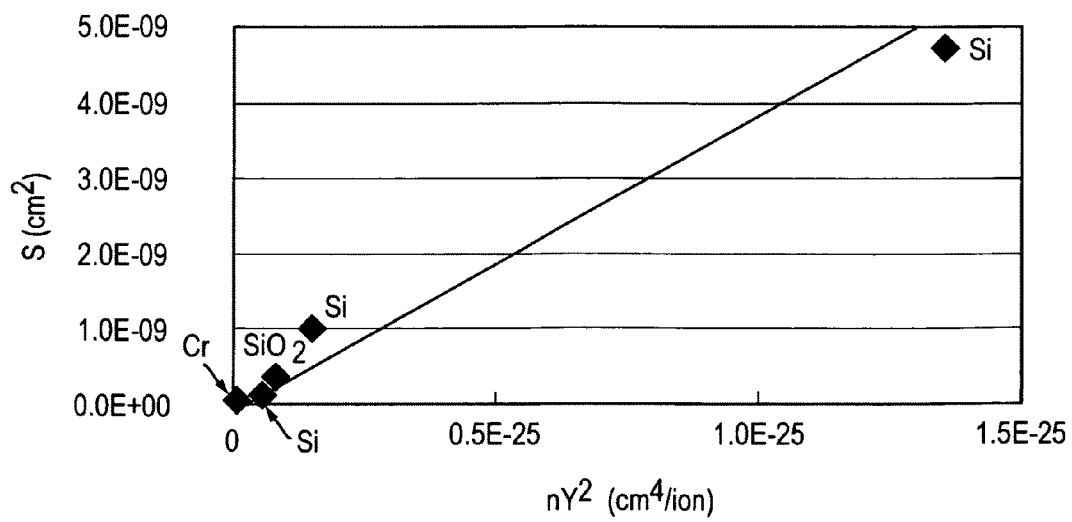
FIG. 4D is a graph showing a relationship between the cross-sectional area S of the deformed corner portion and a product of a square of the etching efficiency Y and the dose n when the Ar gas cluster ion beam is used on a variety of solid substances (silicon, silicon dioxide, and chromium)

FIG. 4D shows the relationship between the cross-sectional area S and the product of the square of the etching efficiency Y and the dose n observed on silicon, silicon dioxide, and chromium. The relationship shows that the cross sectional area S increases in proportion to $n*Y^2$.

Based on those results, Equations (1) and (2) were obtained. The values of proportionality factors a and b obtained from FIGS. 4C and 4D are almost constant for any type of solid material: $a \approx 3.80*10^{16}$ [ions/$cm^2$]; $b \approx 6.25*10^8$ [ions$^{1/2}$/cm$^{-1}$]. The values are correct to three significant figures. Accordingly, the cluster protection layer can be made of any material, and the cluster protection layer should be formed to have a thickness greater than the deformation depth d calculated from Equation (5).

The thickness T of the cluster protection layer when the Ar gas cluster ion beam is used is obtained from Equation (7), which is obtained by substituting the values of constants a and b into Equation (6):

$$T > nY + (1.54*10^{16} nY^2)^{1/2}, \qquad (7)$$

where n is the dose [ions/$cm^2$] of the gas cluster ion beam, and the etching efficiency Y is given as the etching volume per cluster ion [$cm^3$/ion].

If the gas source of the gas cluster ion beam is not Ar, the values of the proportionality factors a and b are different, but the other results are the same as those with the Ar gas cluster ion beam described above. The results of experiments using an $SF_6$ (sulfur hexafluoride) gas cluster ion beam are shown in FIGS. 5A, 5B, 5C, and 5D, which correspond to FIGS. 4A, 4B, 4C, and 4D, respectively.

Figure 5A:
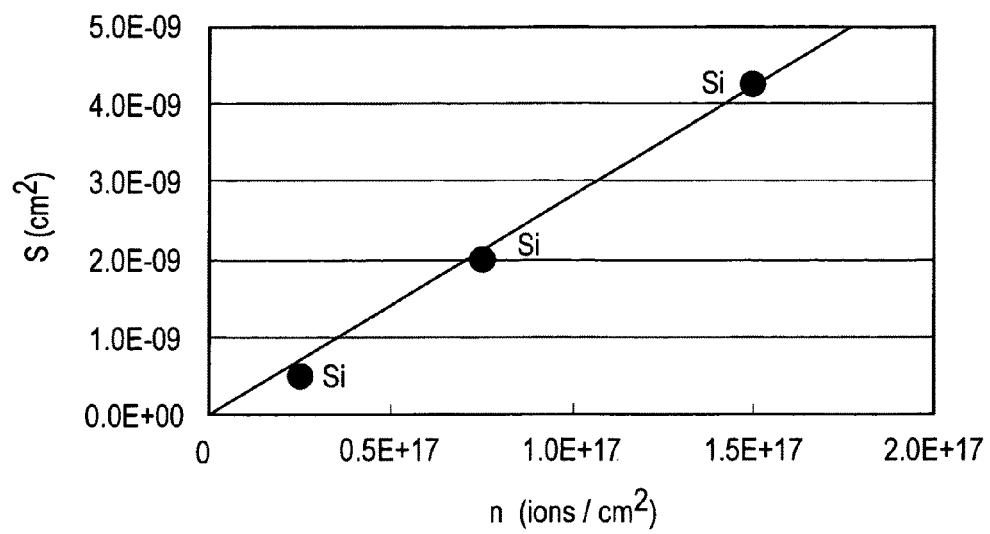
FIG. 5A is a graph showing a relationship between the dose n and the cross-sectional area S of the deformed corner portion when the solid substance is silicon and an $SF_6$ gas cluster ion beam is used.

The deformation depth d and the length L of the oblique side of the corner portion of the line were observed on a variety of materials after $SF_6$ gas cluster ion beam irradiation. The relationship between the dose n and the cross-sectional area S of the incline portion was examined on silicon used as the solid material. The cross-sectional area S increases in proportion to an increase in the dose n (FIG. 5A).

Figure 5B:
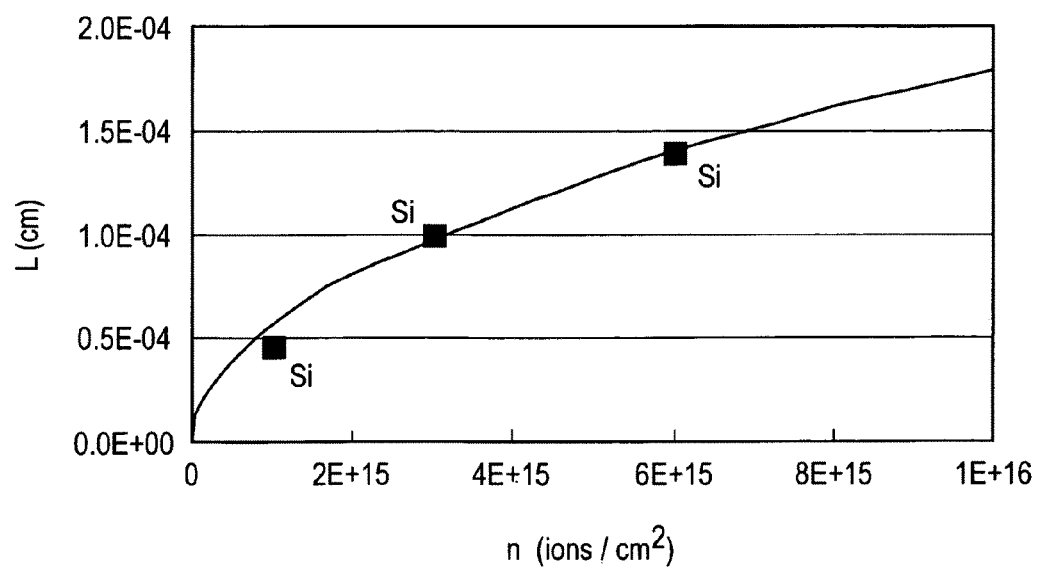
FIG. 5B is a graph showing a relationship between the dose n and the length L of the oblique side when the solid substance is silicon and the $SF_6$ gas cluster ion beam is used.

The relationship between the length L of the oblique side and the dose n was examined on silicon used as the solid material. It was found that the length L of the oblique side was almost proportional to $n^{0.5}$ (FIG. 5B).

Figure 5C:
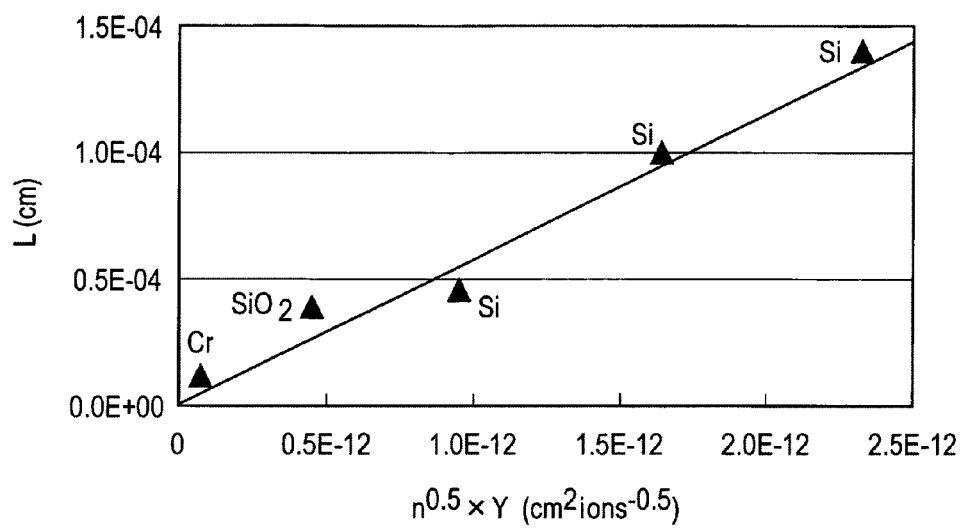
FIG. 5C is a graph showing a relationship between the length L of the oblique side and the product of the etching efficiency Y and $n^{0.5}$ when the $SF_6$ gas cluster ion beam is used on a variety of solid substances (silicon, silicon dioxide, and chromium)

FIG. 5C is a graph showing the relationship between the length L of the oblique side and the product of the etching efficiency Y and $n^{0.5}$ of silicon, silicon dioxide, and chromium. It can be interpreted that most of the obtained data points are on a single straight line.

Figure 5D:
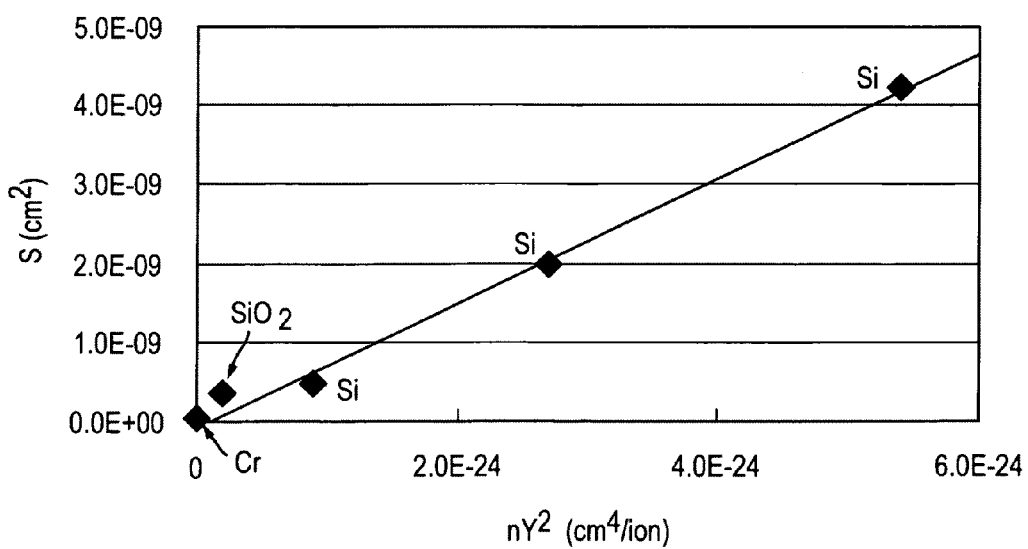
FIG. 5D is a graph showing a relationship between the cross-sectional area S of the deformed corner portion and the product of the square of the etching efficiency Y and the dose n when the $SF_6$ gas cluster ion beam is used on a variety of solid substances (silicon, silicon dioxide, and chromium)

FIG. 5D shows the relationship between the cross-sectional area S of the deformed portion and the product of the square of the etching efficiency Y and the dose n, observed on silicon, silicon dioxide, and chromium. The obtained proportional relationship indicates that a material having a greater value of $nY^2$ has a linearly increasing cross-sectional area S.

Based on the results, the values of constants a and b were constant for any type of solid material when the $SF_6$ gas cluster ion beam was used: $a=7.83*10^{14}$ [ions/$cm^2$]; $b=5.68*10^7$ [ions$^{1/2}$/cm$^{-1}$]. The values are correct to three significant figures. Accordingly, the cluster protection layer can be made of any material, and the cluster protection layer should be formed to have a thickness greater than the deformation depth d calculated from Equation (5).

The thickness T of the cluster protection layer when the $SF_6$ gas cluster ion beam is used is obtained from Equation (8), which is obtained by substituting the values of the proportionality factors a and b into Equation (6), $$T > nY + (1.23*10^{15} nY^2)^{1/2}, \qquad (8)$$

where n is the dose [ions/$cm^2$] of the gas cluster ion beam, and the etching efficiency Y is the etching volume per cluster ion [$cm^3$/ion].

The values of a and b depend on the gas type of the gas cluster ion beam because the proportion of etching to lateral transfer of substance caused by gas cluster ion beam irradiation is different. As the accelerating energy of the gas cluster ion beam increases, both the etching efficiency and the lateral transfer of substance increase, and the proportion of them does not change greatly. Therefore, if the gas type is the same, the values of the proportionality factors a and b do not depend on the accelerating energy.

The cluster protection layer formed on the top face of the line prevents the deformation of corner portions in the upper parts of the side walls of the line below the cluster protection layer, thus allowing surface processing (such as smoothing of the side walls of the line).

An embodiment and examples of the present invention will be described below.

(Masking Process)

Masking means forms a cluster protection layer to cover a solid plane. The masking means may be the same one as included in a general wafer processing apparatus. The masking means in this embodiment is a high-temperature diffusion furnace. For example, a silicon substrate is placed in the high-temperature diffusion furnace and exposed to an oxidizing gas atmosphere at a high temperature (generally around 900° C. to 1100° C.). This forms a thermally oxidized film across the surface of the silicon substrate. The thermally oxidized film corresponds to the cluster protection layer.

(Etching Process)

Etching means conducts dry etching of the solid plane on which the cluster protection layer has been formed. This forms a relief structure on the solid surface. The etching means can be the same one as included in a general wafer processing apparatus. In this embodiment, an etching apparatus is used. An example of etching the silicon substrate on which a thermally oxidized film is formed will be described. The etching is performed as follows. The thermally oxidized film is coated with photoresist. Prebaking is performed to adhere the thermally oxidized film to the photoresist. The photoresist is then exposed to light through a photomask, and the pattern of the photomask is printed (transferred) onto the photoresist. The exposed photoresist is then developed and rinsed. With positive type photoresist, the exposed photoresist is removed. With negative type photoresist, the photoresist that was not exposed to light is removed. Then, postbaking is performed to adhere the photoresist to the thermally oxidized film to improve the corrosion resistance. Then, the silicon substrate which has passed through a series of processes is placed in an etching apparatus; reactive gas is put into the etching apparatus; and a high-frequency power source applies a voltage, which causes dry etching by the reactive gas to advance. Instead of dry etching, wet etching may be performed. After dry etching, an organic solvent or the like is used to remove the photoresist.

(Irradiation Process)

Figure 6:
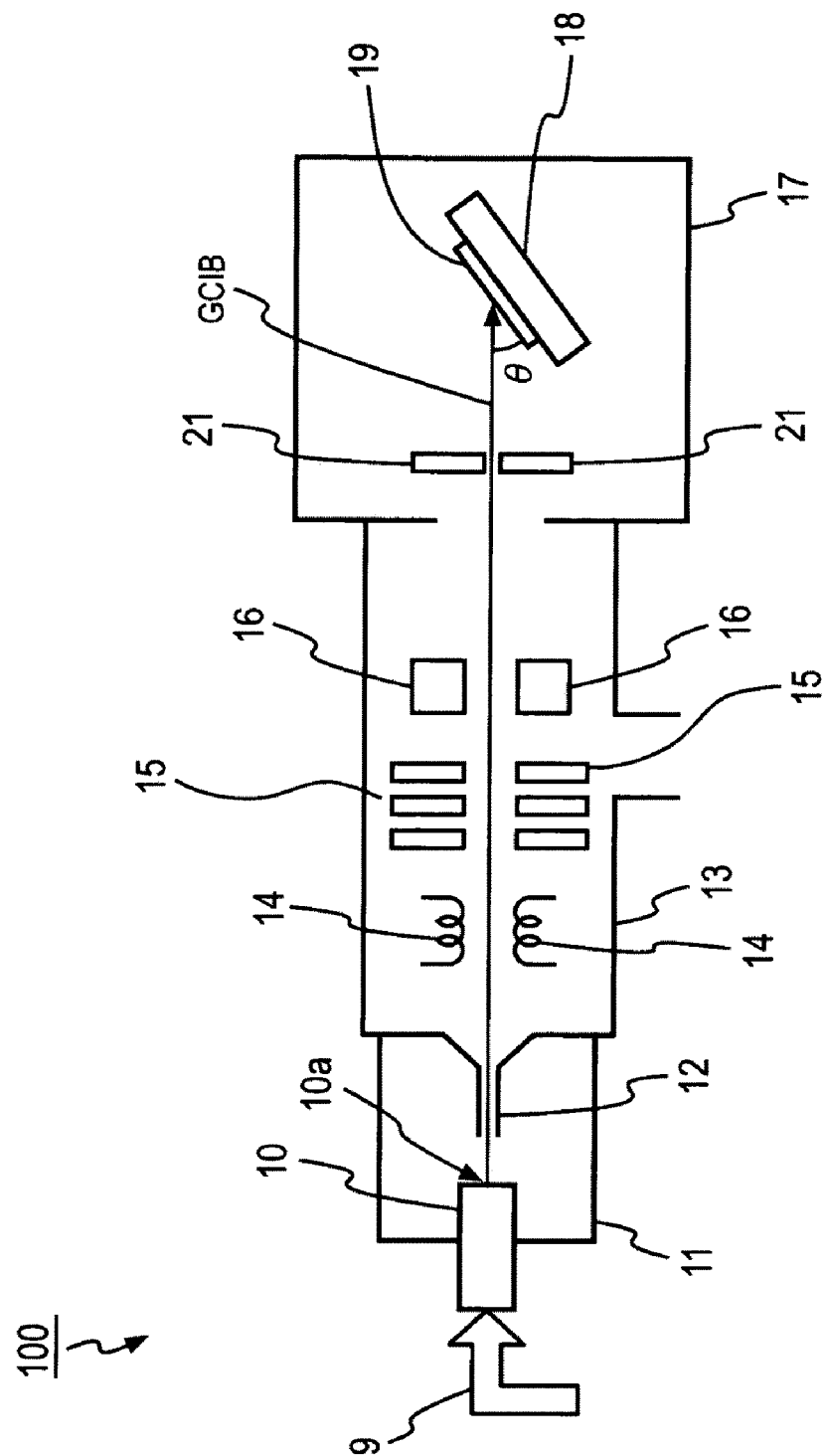
FIG. 6 is a view showing a structure of a solid surface processing apparatus 100.

The structure and functions of a solid surface processing apparatus 100 that implements the gas cluster ion beam irradiation process in the solid surface processing method according to the present invention will be described with reference to FIGS. 6, 7A, and 7B.

The solid surface processing apparatus 100 includes gas cluster ion beam emission means which emits a gas cluster ion beam onto a solid surface. The GCIB emission means shown in FIG. 6 is structured as follows. Source gas 9 is supplied by a nozzle 10 into a vacuum cluster generation chamber 11. Gas molecules of the source gas 9 aggregate into clusters in the cluster generation chamber 11. The size of the clusters is determined by the particle size distribution based on the pressure and temperature of gas at a nozzle outlet 10a and the size and shape of the nozzle 10. The clusters generated in the cluster generation chamber 11 are brought by a skimmer 12 into an ionization chamber 13 to serve as a gas cluster beam. In the ionization chamber 13, an ionizer 14 emits an electron beam, such as a thermal electron beam, and the neutral cluster is ionized. The ionized gas cluster beam (GCIB) is accelerated by an accelerating electrode 15, converged by a magnetic-field convergence unit 16, and input to a sputtering chamber 17. On a target support 18 provided in the sputtering chamber 17, a target 19, which is a solid (such as a silicon substrate on which a relief structure is formed) to be exposed to the GCIB, is fixed on a rotary disc 41. The GCIB entering the sputtering chamber 17 is narrowed to a predetermined beam diameter by an aperture 21 and directed onto the surface of the target 19. When the surface of the target 19 formed of an electrical insulator is smoothed, the GCIB is neutralized by electron beam irradiation.

The solid surface processing apparatus 100 includes determination means which determines whether the thickness of the cluster protection layer, the etching efficiency of the material of the cluster protection layer, and the dose of the gas cluster ion beam satisfy the relationship expressed by Equation (5).

Figure 7A:
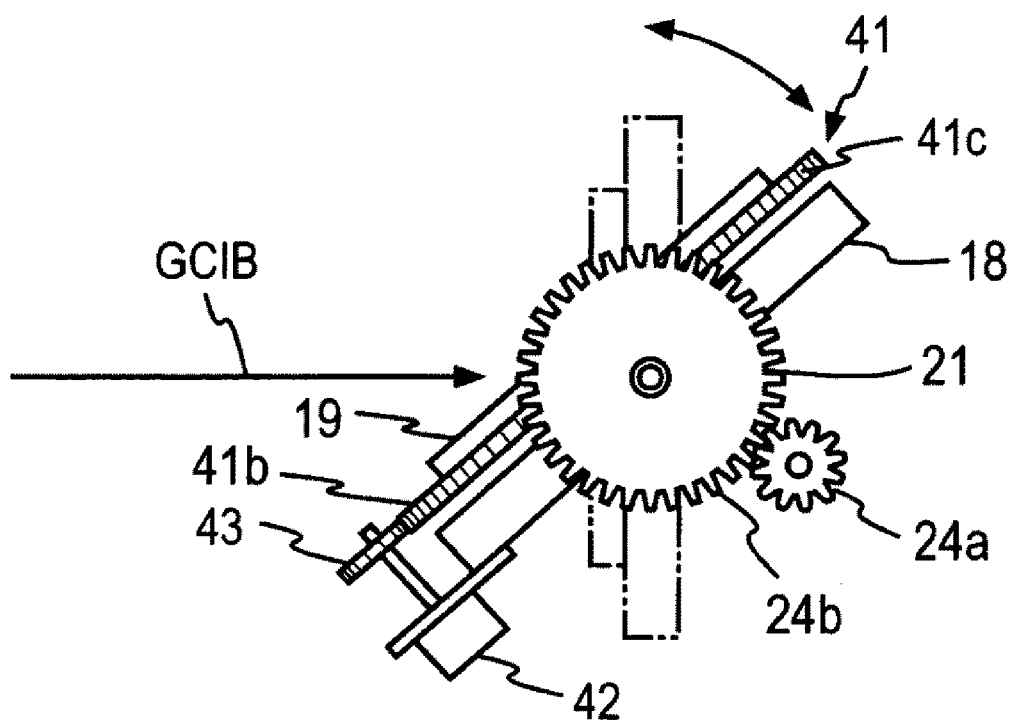
FIG. 7A is a side view showing a first rotation mechanism of the solid surface processing apparatus 100.
Figure 7B:
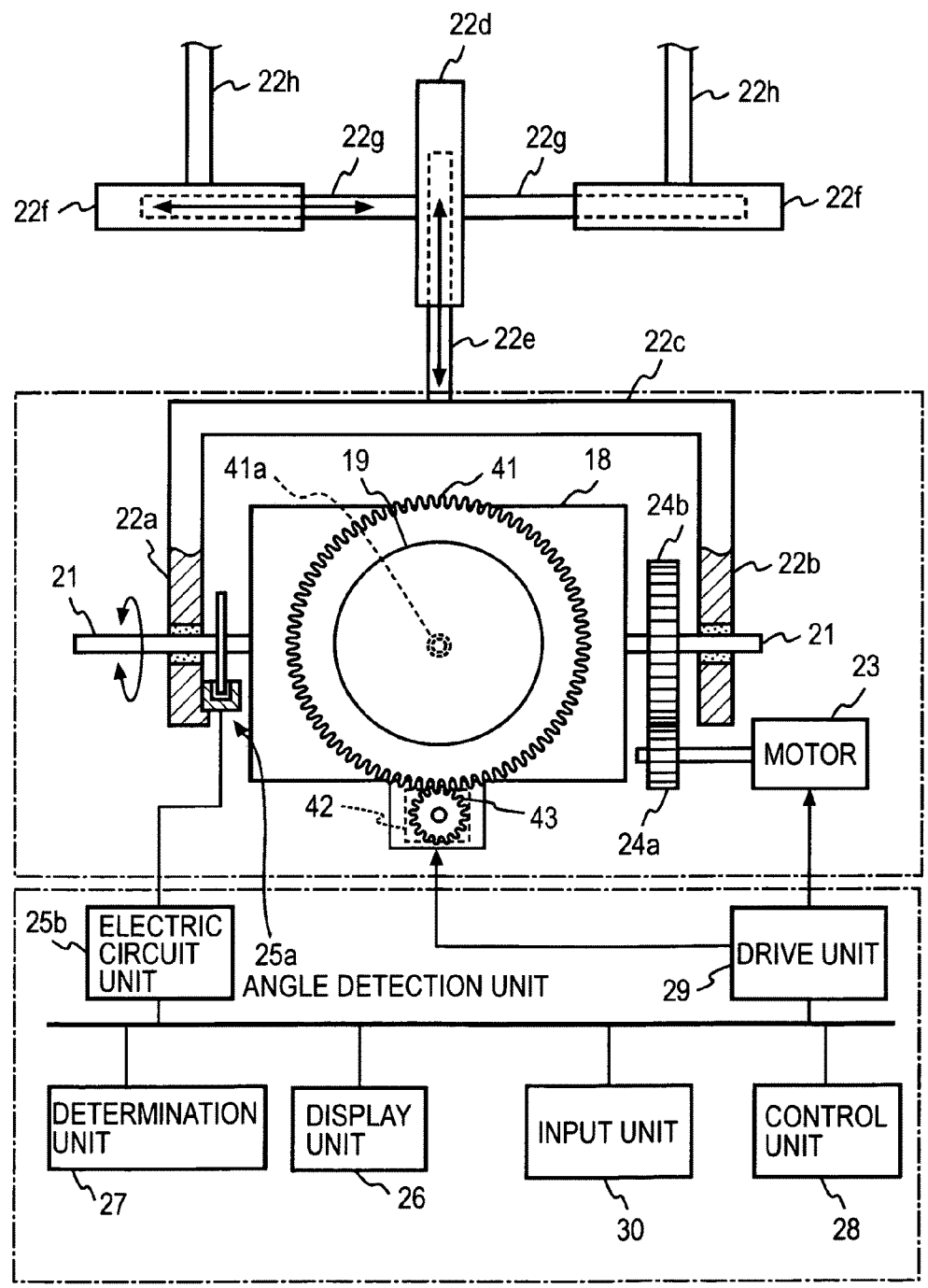
FIG. 7B is a plan view showing the first rotation mechanism, a second rotation mechanism, and a scanning mechanism of the solid surface processing apparatus 100.

For example, an input unit 30 such as a keyboard is connected to the solid surface processing apparatus 100, as shown in FIG. 7B. Through the input unit 30, the thickness of the cluster protection layer, the etching efficiency of the material of the cluster protection layer, and the dose of the gas cluster ion beam are input. A determination unit 27 determines whether the input thickness of the cluster protection layer, the input etching efficiency of the material of the cluster protection layer, and the input dose of the gas cluster ion beam satisfy the relationship of Equation (5) and outputs the result of the determination. The result is displayed on a display unit 26.

The structure is not limited to that described above. For example, the thickness of the cluster protection layer and the etching efficiency of the material of the cluster protection layer may be input through the input unit 30, and the determination unit 27 may obtain a dose of the gas cluster ion beam satisfying the relationship of Equation (5) on the basis of the input thickness of the cluster protection layer, the input etching efficiency of the material of the cluster protection layer, and Equation (5). The dose of the gas cluster ion beam obtained by the determination unit 27 is displayed on the display unit 26.

The solid surface processing apparatus 100 also includes means that can set the irradiation angle to alternately and obliquely irradiate opposite side walls of the relief structure formed on the solid plane by the etching means with the GCIB (alternate irradiation means) or means that can rotate the solid on an axis approximately parallel to the normal to the solid plane to be irradiated with the GCIB (rotary irradiation means), or includes both of the means, when needed. This embodiment includes rotation mechanisms that implement the above two means.

As shown in FIGS. 7A and 7B, for instance, the solid surface processing apparatus 100 includes a first rotation mechanism and a second rotation mechanism.

The first rotation mechanism corresponds to the rotary irradiation means and is structured as follows. The target support 18 has a protruding shaft 41a, and the rotary disc 41 is mounted on the shaft 41a to rotate on the center of the shaft 41a. The rotary disc 41 has a flat part 41b, on which the target 19 is attached. The rotary disc 41 has a great number of teeth in its rim 41c, and the teeth engage with the teeth of a gear 43. The gear 43 rotates when driven by a motor 42, and the rotation is transferred to the rotary disc 41, thereby rotating the target 19 attached to the rotary disc 41. For example, by rotating the rotary disc 41 at a constant angular velocity continuously, the target 19 can be rotated on a shaft almost parallel to the normal to the solid plane to be irradiated with the GCIB while the target 19 is being irradiated with the GCIB.

The second rotation mechanism corresponds to alternate irradiation means and is structured as follows. A rotation shaft 21 is fixed to the target support 18, and the target support 18 can rotate on the center of the rotation shaft 21. The rotation shaft 21 is rotatably supported by stationary plates 22a and 22b. The rotation shaft 21 is fixed also to the center of the rotation axis of a gear 24b, and the gear 24b engages with a gear 24a. The gear 24a rotates when driven by a motor 23, and the rotation is transferred to the gear 24b and the rotation shaft 21, thereby rotating the target support 18. Suppose that a rotation in a certain direction with respect to the reference angle is expressed by adding a plus sign (+) to the angle of rotation and that a rotation in the opposite direction is expressed by adding a minus sign (−) to the angle of rotation. The GCIB can be emitted to the target 19 obliquely and alternately by repeating these steps: The target support 18 is held still in a position +θ (θ expresses the magnitude of the angle of rotation); the target 19 is irradiated with the GCIB; after a predetermined period of time, the target support 18 is rotated and held still in a position −θ' (θ' expresses the magnitude of the angle of rotation; usually, θ~θ'); the GCIB is emitted to the target 19; after a predetermined period of time, the target support 18 is rotated and held still in the position +θ; and the GCIB is emitted onto the target 19.

The solid surface processing apparatus 100 is further equipped with a scanning mechanism for changing the relative position of the target 19 with respect to the GCIB, such as an XY stage.

The stationary plates 22a and 22b are fixed to and supported by a stationary-plate supporting member 22c, as shown in FIG. 7B. The stationary-plate supporting member 22c and a first actuator 22d are connected via a first rod 22e. The first actuator 22d can push and pull the first rod 22e, and this action can change the position of the target support 18. In the solid surface processing apparatus 100 shown in FIG. 7B, for example, the motion of the first actuator 22d can change the position of the target support 18 towards the top or bottom on the page.

The first actuator 22d is fixed to and supported by a second rod 22g, and the first actuator 22d is connected to second actuators 22f through the second rod 22g. The second actuators 22f can push and pull the second rod 22g, and this action changes the position of the first actuator 22d. Consequently, the position of the target support 18 connected to the first actuator 22d via the first rod 22e and the other parts mentioned above can be changed. The direction in which the first rod 22e can move is nearly orthogonal to the direction in which the second rod 22g can move. In that way, a scanning mechanism like an XY stage is implemented. In the solid surface processing apparatus 100 shown in FIG. 7B, for example, the motion of the second actuators 22f can change the position of the target support 18 towards the left or right on the page. Therefore, in combination with the motion of the first actuator 22d, the target support 18 can be moved up and down, and left and right on the page.

A control unit 28 drives the motor 23 and the motor 42 through a drive unit 29 and controls the motion of the target support 18 and the rotary disc 41. The control unit 28 further controls the GCIB emission means so that the GCIB of an input dose or a dose obtained by the determination unit 27 is emitted.

The control unit 28 includes a CPU (central processing unit) or a microprocessor and controls the operation as described above by executing programs required to control the solid surface processing, such as displaying information and driving the motors.

The solid surface processing apparatus is not limited to the structure and mechanism of the solid surface processing apparatus 100 described above, and modifications can be made as needed within the scope of the present invention.

In the solid surface processing apparatus 100, the solid plane on which a relief structure has been formed in the etching process is irradiated with a gas cluster ion beam and then transferred to a removal process.

(Removal Process)

In the solid surface processing apparatus 100, removal means removes the remaining cluster protection layer from the solid plane irradiated with the gas cluster ion beam. The removal means can be the same one as included in a general wafer processing apparatus. In this embodiment, an ashing apparatus is used. The silicon substrate which has gone through a series of processes is placed in the ashing apparatus, and the thermally oxidized film is removed from the surface of the silicon substrate by oxidative decomposition and ashing.

In the embodiment described above, a relief structure having protrusions with a cluster protection layer formed on their upper part and recesses without a cluster protection layer is formed on the solid plane, through the masking process, in which the cluster protection layer is formed over the solid plane, and the etching process, in which the solid plane coated with the cluster protection layer formed in the masking process is etched. The method of forming a relief structure having protrusions with a cluster protection layer formed on their upper part (top face) is not limited to the one described here.

For example, it is possible to use a method in which the solid plane is coated with photoresist, and a relief structure is formed on the solid plane through patterning and etching; and a sticky resin is pressed against the solid plane having the relief structure to attach the resin selectively onto the top face of the protrusions.

The word "selectively" has two meanings here. The first meaning is that the resin is attached to the top face of the protrusions not to the side walls of the protrusions or the bottom of the recesses, by preventing the resin from entering the recesses. The second meaning is that because the position and shape to which the resin is attached can be specified as needed, the top face of the protrusions to which the resin is attached and the top face of the protrusions to which the resin is not attached can be selected.

The resin attached to the top face of the protrusions is hardened by heating or other means, and that part is used as the cluster protection layer.

The following method can also be used: The solid plane is coated with a cluster protection layer in the same masking process as that described above; photoresist is applied on the cluster protection layer; patterning is performed; the cluster protection layer is removed in accordance with the pattern by dry etching, ion beam irradiation or gas cluster ion beam irradiation; and a part of the solid plane exposed after the removal of the cluster protection layer is irradiated with a gas cluster ion beam, to form recesses in the solid plane. In this way, a relief structure can be formed by providing protrusions having a cluster protection layer formed on their top face and recesses without a cluster protection layer.

In short, a relief structure having protrusions with a cluster protection layer on their top face and recesses without a cluster protection layer should be formed on the solid plane. The present invention does not limit the forming method specifically.

Examples will now be described.

Ar gas clusters and $SF_6$ gas clusters were used. The source of the Ar gas clusters was Ar gas. An Ar gas cluster beam was generated, the beam having a particle size distribution with a peak cluster size of about 2000 Ar atoms, and the beam was emitted onto the target 19 at an accelerating voltage of 30 kV. The source of the $SF_6$ gas clusters was $SF_6$ gas and He gas. An $SF_6$ gas cluster ion beam was generated, the beam having a particle size distribution with a peak cluster size of about 500 $SF_6$ molecules, and the beam was accelerated at an accelerating voltage of 30 kV and emitted onto the target 19.

A line-and-space pattern structure having lines and spaces of 1 μm wide and 0.5 μm deep was formed on a surface of a silicon substrate as follows: A thermally oxidized film was formed on the silicon surface in a high-temperature diffusion furnace; the silicon substrate having the oxidized film was coated with electron beam resist; a pattern structure was drawn on the resist by an electron beam drawing apparatus; after the resist was developed, the resist pattern was used as a mask when the thermally oxidized film was etched by a reactive ion etching (RIE) apparatus; the resist was removed; and the thermally oxidized film was used as a hard mask when the silicon was etched by using an inductively coupled plasma reactive ion etching (ICP-RIE) apparatus. Although the thermally oxidized film used as the hard mask is usually removed, the film was not removed but was left on the pattern in the examples. With this method, samples A to E having a thermally oxidized layer (cluster protection layer) with different film thicknesses within the range of 50 nm to 2 μm were fabricated. After GCIB irradiation as will be described later in each example, the thermally oxidized film used as the cluster protection layer was ashed and removed by an ashing apparatus.

FIRST EXAMPLE

An experiment was conducted to adjust the line width of the fabricated silicon pattern. The dose was increased for samples having a thermally oxidized film with greater thicknesses, in order to decrease the line width. The side wall of the line was irradiated with the Ar gas cluster ion beam at an irradiation angle of 7° from the side wall of the line (83° to the normal to the side wall of the line). The line width was adjusted by etching. The decrement was 5 to 150 nm, and the dose of irradiation was $1.3*10^{14}$ ions/cm$^2$ for 1 nm of etching.

Figure 8:
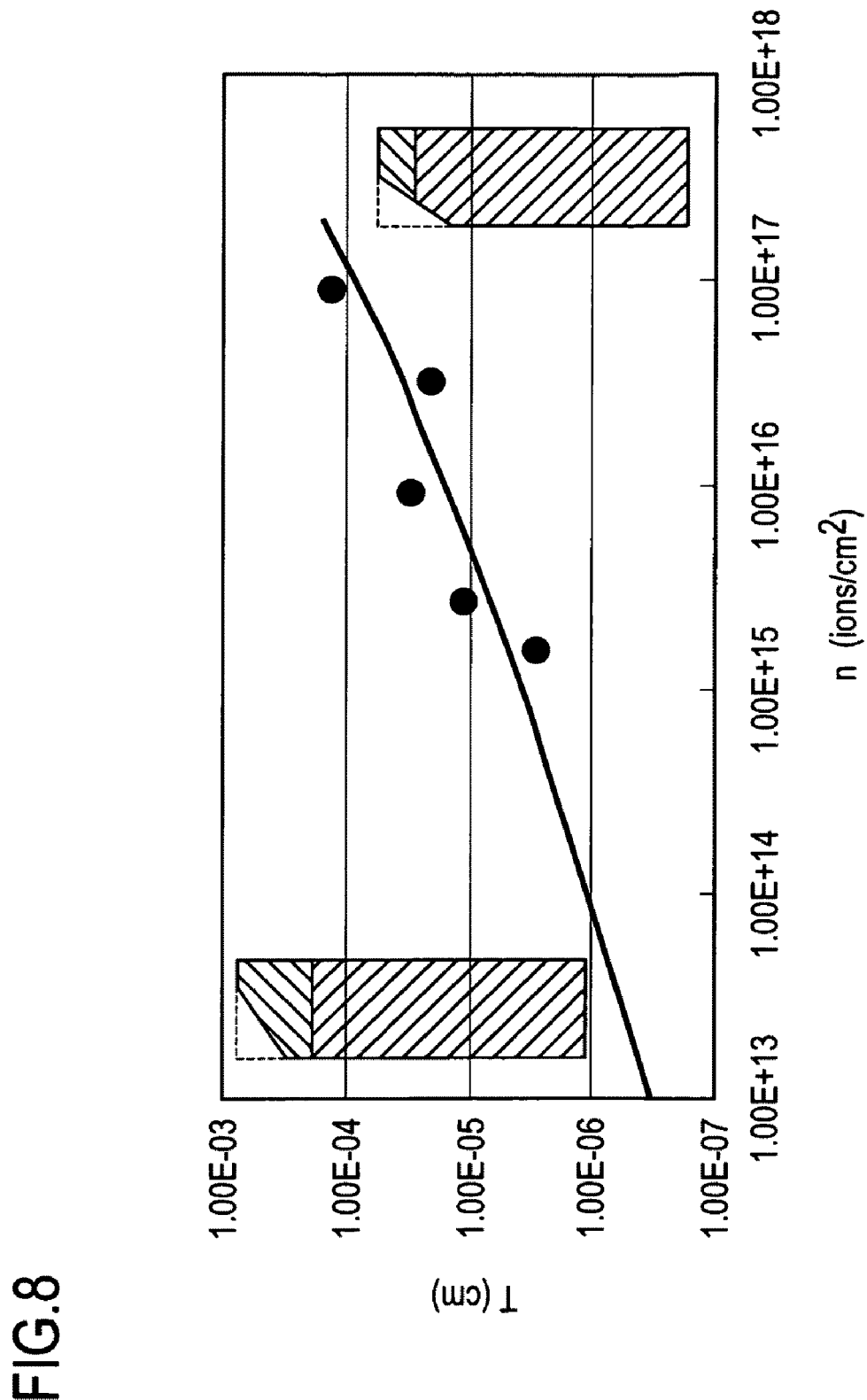
FIG. 8 is a graph showing a relationship between the dose n and a thickness T of a cluster protection layer in a first example.

To check the change in pattern shape, the cross section of the line-and-space pattern structure was observed by an electron microscope before and after the GCIB irradiation. The result is shown in the graph of FIG. 8. In FIG. 8, the value on the right side of Equation (7), using the etching efficiency of silicon dioxide $Y=5*10^{-22}$ cm$^3$/ion (at an irradiation angle of 7°), is represented by a solid line. If the relationship between the dose of irradiation of the Ar gas cluster ion beam and the thickness of the thermally oxidized film was above the curve representing the right side of Equation (7), the thermally oxidized film was considered to be functioning as a cluster protection layer (that is, corners of the silicon pattern will not be deformed). If the relationship was below the curve, the film was considered not to be functioning as a cluster protection layer.

After the thermally oxidized film was removed by ashing, the oblique angle φ of the line portion of silicon was 0 degrees, indicating that the corners were not deformed. As the mean surface roughness of the side walls of the line, the mean surface roughness of the samples was measured by an atomic force microscope (AFM) before and after the GCIB irradiation. When the mean surface roughness of the side wall of the line was measured, the samples were cut to expose the line side wall. The mean surface roughness (Ra) of the line side wall before the GCIB irradiation was 3.8 nm. After SF$_6$ gas cluster ion beam irradiation, the mean line width was 1.00 μm, and the mean surface roughness (Ra) of the line side wall was 0.52 nm.

SECOND EXAMPLE

Figure 9:
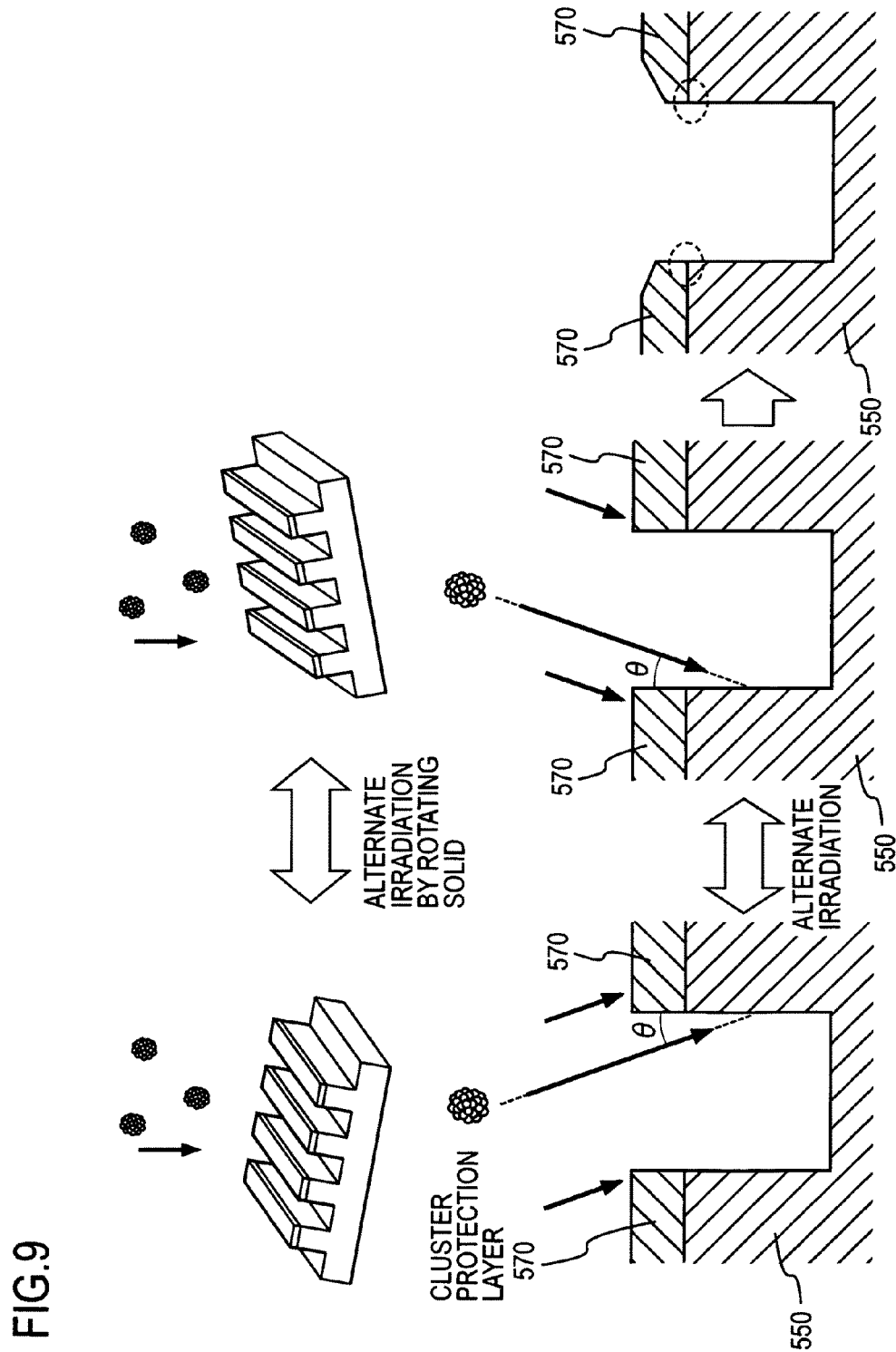
FIG. 9 is a view showing that corner portions of the relief structure are protected from deformation when they are alternately irradiated with a gas cluster ion beam (example 2)

An SF$_6$ gas cluster ion beam was alternately emitted to opposite side walls of a line at an angle θ of 7°. The example is illustrated in FIG. 9.

To decrease the pattern width by 30 nm, the dose was $1.0*10^{14}$ ions/cm$^2$ for each side, and the opposite sides were irradiated alternately. The thickness of the thermally oxidized film was T=0.6 μm. After the thermally oxidized film was removed, the pattern width was 1.00 μm, and the roughness (Ra) of the line side wall was 0.49 nm. After the thermally oxidized film was removed by ashing, the silicon line had an oblique angle φ of 0 degrees, indicating that the corners were not deformed.

THIRD EXAMPLE

A pattern structure formed by an array of cylindrical recesses in silicon (diameter of 1 μm, square array with a pitch of 1 μm) was fabricated by the same method as for the line-and-space patterns of the examples described above. The silicon substrate was rotated in the plane while the side wall of the cylindrical recess was irradiated with the GCIB at an angle θ of 7°. This example is illustrated in FIG. 10. The left diagram of FIG. 10 is a plan view of the pattern of the array of cylinderical recesses, and the arrow represents the in-plane rotation of the silicon substrate. The right diagram of FIG. 10 is a cross sectional view of the cylindrical recess.

To increase the diameter of the cylindrical recess by 30 nm, the dose was $3.0*10^{15}$ ions/cm$^2$. The thickness T of the thermally oxidized film was 0.6 μm. After the thermally oxidized film was removed, the pattern width was 1.00 μm, and the mean surface roughness (Ra) of the side wall of the cylindrical recess was 0.49 nm. After the thermally oxidized film was removed by ashing, the angle φ of the upper part of the silicon protrusion was 0 degrees, which was the same as the designed value.

<Conclusion Based on the Examples>

The first, second, and third examples show that the line width can be adjusted without deforming the corners of the upper part of the line-and-space pattern structure in the solid state, by adjusting the line width by using a thermally oxidized film having a thickness satisfying Equation (7) as a cluster protection layer and then removing the thermally oxidized film.

In the examples, the accelerating voltage was 30 kV. As the accelerating voltage increases, the etching amount increases, reducing the smoothing time. On the other hand, increased accelerating voltage could degrade the surface roughness. Therefore, the accelerating voltage should be determined in accordance with the requirements of solid surface processing, such as time and material. Neither the parameters nor the apparatus conditions, such as gas type, irradiation conditions, and cluster size, is limited and the parameters and the apparatus conditions can be changed as necessary.

Industrial Applicability

Since the corner portions of the relief structure on the solid surface can be protected from deformation, the present invention can be applied to the fabrication of high-precision three-dimensional structures such as high-performance semiconductor devices or optical devices and dies for fabricating those devices.

Effects of the Invention

In the present invention, a gas cluster ion beam is emitted onto a solid surface having a relief structure with a cluster protection layer formed to cover it, so that corner portions of the relief structure can be protected from deformation.

What is claimed is:

1. A method of processing a solid surface with a gas cluster ion beam comprising:
    a cluster-protection-layer formation step of forming, on the solid surface, relief structure having protrusions with a cluster protection layer formed to cover an upper part thereof and recesses without the cluster protection layer, wherein the cluster protection layer is formed to have the thickness T [cm] obtained from calculations dependent n [ions/cm$^2$] of the gas cluster ion beam and an etching efficiency Y of the cluster protection layer, given as etching volume per cluster of the gas cluster ion beam [cm³/ion], such that $$T > nY + \left(\frac{b^2Y^2n - nY^2(b^4 - 16a^2)^{\frac{1}{2}}}{2}\right)^{\frac{1}{2}},$$

where a is a proportionality factor [ions/cm²] between nY² [cm⁴/ion] and an area S [cm²] of a region of the cluster protection layer etched by the gas cluster ion beam, in a cross section perpendicular to a direction in which the protrusions or the recesses extend; b is a proportionality factor [ions$^{1/2}$cm$^{-1}$] between Yn$^{1/2}$ [cm²·ions$^{-1/2}$] and a length L [cm] of an oblique side of the region of the cluster protection layer etched by the gas cluster ion beam;
an irradiation step of emitting the gas cluster ion beam onto the solid surface on which the relief structure has been formed in the cluster-protection-layer formation step; and
a removal step of removing the cluster protection layer.

2. The method of processing a solid surface with a gas cluster ion beam according to claim 1, wherein the gas cluster ion beam is an Ar gas cluster beam and the thickness T [cm] of the cluster protection layer satisfies $$T > nY + (1.54*10^{16}*nY^2)^{1/2}.$$

3. The method of processing a solid surface with a gas cluster ion beam according to claim 1, wherein the gas cluster ion beam is an SF$_6$ gas cluster ion beam and the thickness T [cm] of the cluster protection layer satisfies $$T > nY + (1.23*10^{15}*nY^2)^{1/2}.$$

4. The method of processing a solid surface with a gas cluster ion beam according to any one of claims 1 through 3, wherein the cluster-protection-layer formation step comprises:
a masking process of forming the cluster protection layer to cover the solid surface; and
an etching process of etching the solid surface having the cluster protection layer formed in the masking process, thereby forming the relief structure having the recesses reaching the solid and the protrusions with the cluster protection layer left on the upper part thereof.

5. The method of processing a solid surface with a gas cluster ion beam according to any one of claims 1 through 3, wherein, in the irradiation step, the gas cluster ion beam is alternately emitted obliquely onto opposite side walls of the relief structure.

6. The method of processing a solid surface with a gas cluster ion beam according to any one of claims 1 through 3, wherein, in the irradiation step, the solid is rotated on an axis approximately parallel to the normal to the solid surface on which the relief structure is formed while being irradiated with the gas cluster ion beam.

* * * * *

UNITED STATES PATENT AND TRADEMARK OFFICE
CERTIFICATE OF CORRECTION

| | |
|---|---|
| PATENT NO. | : 8,268,183 B2 |
| APPLICATION NO. | : 12/312266 |
| DATED | : September 18, 2012 |
| INVENTOR(S) | : Akiko Suzuki et al. |

It is certified that error appears in the above-identified patent and that said Letters Patent is hereby corrected as shown below:

In the drawings, Sheet 10, Fig. 7A, the reference numeral 21 should be applied to the rotation shaft at the center of the gear 24b.

Column 7, line 53, the expression "b~6.25*10$^8$" should appear as follows:
$b \approx 6.25*10^8$ Column 11, line 8, the expression "θ~θ'" should appear as follows:
$\theta \approx \theta'$ Column 14, line 62, "relief structure" should be --a relief structure--; lines 65-66, "the thickness T" should be --a thickness T--; lines 66-67, "dependent n" should be --dependent on n--.

Column 15, lines 13-14, the expression "ions$^{1/}$ 2cm$^{-1}$" should appear as follows:
$ions^{1/2} cm^{-1}$ Signed and Sealed this
Twelfth Day of March, 2013

Teresa Stanek Rea
*Acting Director of the United States Patent and Trademark Office*